(12) United States Patent
Kim et al.

(10) Patent No.: US 9,083,368 B2
(45) Date of Patent: Jul. 14, 2015

(54) IMAGE SENSOR USING OFFSET CODE FOR COUNTING

(71) Applicant: SAMSUNG ELECTRONICS CO., LTD., Suwon-si, Gyeonggi-do (KR)

(72) Inventors: Jin Woo Kim, Seoul (KR); Kyoung Min Koh, Hwaseong-Si (KR); Kyung-Min Kim, Suwon-Si (KR); Hee Sung Chae, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 153 days.

(21) Appl. No.: 13/770,836

(22) Filed: Feb. 19, 2013

(65) Prior Publication Data
US 2013/0243147 A1    Sep. 19, 2013

(30) Foreign Application Priority Data
Mar. 19, 2012 (KR) .......... 10-2012-0027959

(51) Int. Cl.
| | |
|---|---|
| H04N 5/335 | (2011.01) |
| H03M 1/12 | (2006.01) |
| H04N 5/376 | (2011.01) |
| H04N 5/378 | (2011.01) |
| H03M 1/08 | (2006.01) |
| H03M 1/56 | (2006.01) |

(52) U.S. Cl.
CPC .............. *H03M 1/12* (2013.01); *H03M 1/0863* (2013.01); *H04N 5/378* (2013.01); *H04N 5/3765* (2013.01); *H03M 1/123* (2013.01); *H03M 1/56* (2013.01)

(58) Field of Classification Search
CPC ............................ H04N 5/378; H04N 5/3765
USPC ........................................................ 348/308
See application file for complete search history.

(56) References Cited

U.S. PATENT DOCUMENTS

| | | | |
|---|---|---|---|
| 7,705,897 B2 * | 4/2010 | Muramatsu | 348/294 |
| 7,755,017 B2 | 7/2010 | Taura | |
| 7,775,017 B2 * | 8/2010 | Stowell | 53/287 |
| 7,880,662 B2 * | 2/2011 | Bogaerts | 341/169 |
| 7,961,238 B2 | 6/2011 | Nitta et al. | |
| 2008/0136948 A1 * | 6/2008 | Muramatsu | 348/294 |
| 2009/0046190 A1 | 2/2009 | Matsumoto | |
| 2009/0166513 A1 | 7/2009 | Abe et al. | |
| 2009/0195682 A1 | 8/2009 | Koh et al. | |
| 2009/0256735 A1 * | 10/2009 | Bogaerts | 341/169 |
| 2009/0316015 A1 | 12/2009 | Iwasa et al. | |

FOREIGN PATENT DOCUMENTS

JP       2010178197 A       8/2010

* cited by examiner

*Primary Examiner* — Ahmed A Berhan
(74) *Attorney, Agent, or Firm* — Volentine & Whitt, PLLC

(57) ABSTRACT

An image sensor includes multiple counters and a counter controller. Each counter of the multiple counters is configured to perform counting of a comparison result signal and to generate a count result, the comparison result signal being obtained by comparing a ramp signal and a pixel signal of a column of multiple columns. The counter controller is configured to generate and transmit a counter clock signal and (n−1) delay clock signals to the counters, respectively, "n" being a natural number equal to or greater than two. Each delay clock signal of the (n−1) delay clock signals is obtained by delaying the counter clock signal by a corresponding offset code.

18 Claims, 15 Drawing Sheets

FIG. 13
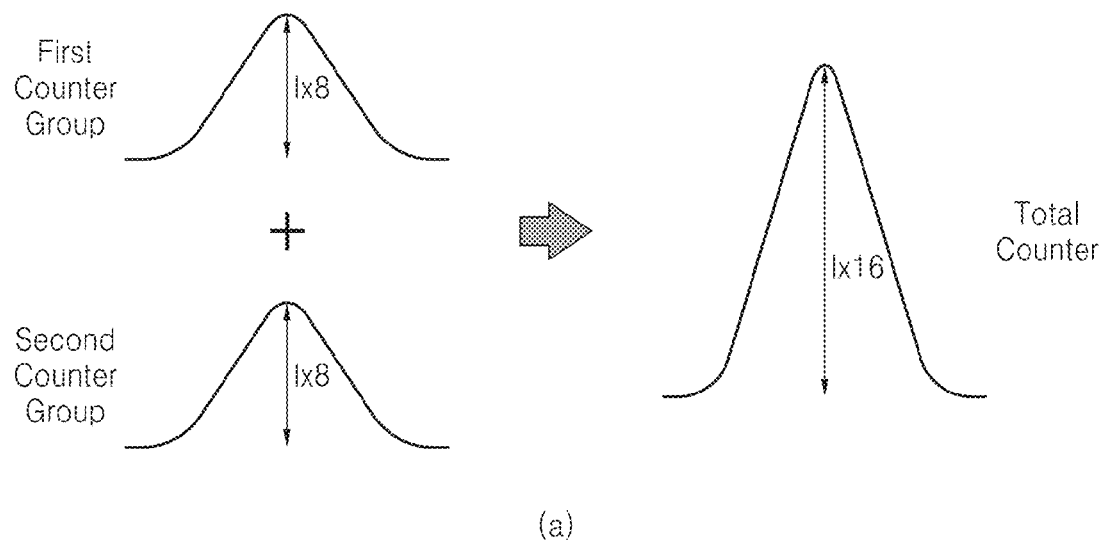
(a)
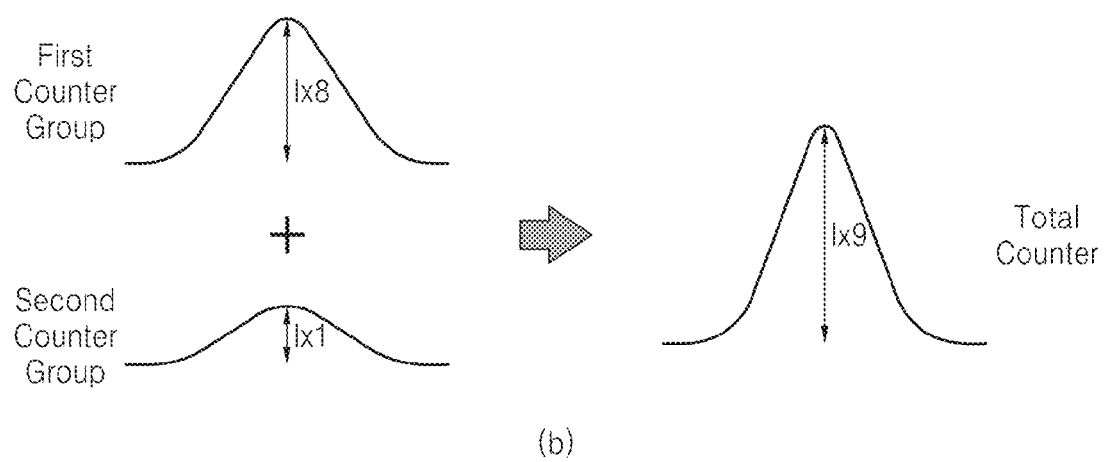
(b)

FIG. 14

|   | Normal (Case 1) | Offset Code=2 (Case 2) | Offset Code=3 (Case 3) |
|---|---|---|---|
| 1 | 0 0 0 | 0 1 0 | 0 1 1 |
| 2 | 0 0 1 | 0 1 1 | 1 0 0 |
| 3 | 0 1 0 | 1 0 0 | 1 0 1 |
| 4 | 0 1 1 | 1 0 1 | 1 1 0 |
| 5 | 1 0 0 | 1 1 0 | 1 1 1 |

# IMAGE SENSOR USING OFFSET CODE FOR COUNTING

CROSS-REFERENCE TO RELATED APPLICATIONS

A claim for priority under 35 U.S.C. §119 is made to Korean Patent Application No. 10-2012-0027959 filed on Mar. 19, 2012, in the Korean Intellectual Property Office, the entire contents of which are hereby incorporated by reference.

BACKGROUND

Embodiments of the inventive concept relate to an image sensor, and more particularly, to an image sensor for reducing peak current by controlling counters in a plurality of groups.

An image sensor is a device that captures a two-dimensional or a three-dimensional image of an object. The image sensor generates the image of an object using a photoelectric conversion element, which reacts to the intensity of light reflected from the object. Recently, with the development of complementary metal-oxide semiconductor (CMOS) technology, use of CMOS image sensors has increased significantly.

A CMOS image sensor uses correlated double sampling (CDS) for image capturing, counts a sampled signal resulting from the CDS, e.g., a difference between a reset signal and an image signal, and outputs a digital signal corresponding to a count result. Power is consumed during the counting, and during a certain period, e.g., during multi-bit toggling, high peak current may occur. Peak current higher than a predetermined level may degrade the quality of pixel data and cause malfunctions in the system. For example, when multiple bits are toggled with respect to data output from each column in an image sensor, multiple column counters simultaneously toggle, causing peak current to occur. A high peak current affects results of reading out pixel data, deteriorating data quality. Accordingly, technology for preventing or reducing high peak current is needed.

SUMMARY

According to embodiments of the inventive concept, an image sensor includes multiple counters and a counter controller. Each counter of the multiple counters is configured to perform counting of a comparison result signal and to generate a count result, the comparison result signal being obtained by comparing a ramp signal and a pixel signal of a column of multiple columns. The counter controller is configured to generate and transmit a counter clock signal and (n−1) delay clock signals to the counters, respectively, "n" being a natural number equal to or greater than two. Each delay clock signal of the (n−1) delay clock signals is obtained by delaying the counter clock signal by a corresponding offset code.

The counters may be grouped into "n" counter groups, including first through n-th counter groups. The counter clock signal may be transmitted to the first counter group and the (n−1) delay clock signals may be transmitted to the second through n-th counter groups, respectively.

According to other embodiments of the inventive concept, an image sensor includes multiple counters and a counter controller. Each counter of the multiple counters is configured to perform counting of a comparison result signal and to generate a count result, the comparison result signal being obtained by comparing a ramp signal and a pixel signal of a column of multiple columns. The counter controller is configured to generate and transmit a counter clock signal and (n−1) counter setting signals to the counters, respectively, "n" being a natural number equal to or greater than two. Each counter setting signal of the (n−1) delay clock signals increases a count value stored in a corresponding counter of the counters by a corresponding offset code.

The counters may be grouped into "n" counter groups including first through n-th counter groups. The counter clock signal may be transmitted to the first through n-th counter groups. The (n−1) counter setting signals may be transmitted to the second through n-th counter groups, respectively.

According to other embodiments of the inventive concept, a method is provided for sensing an image signal using an image sensor, where the image sensor includes multiple counters grouped into at least a first counter group and a second counter group. The method includes resetting the counters in the first and second counter groups; performing counting of a reset signal in the first and second counter groups using a counter clock signal and an offset code, such that counts by the counters in the first counter group are offset from counts by the counters in the second counter group by a value of the offset code; changing the counts of the first and second counter groups into negative values, respectively; and performing counting of the image signal in the first and second counter groups beginning at the negative values using the counter clock signal. Using the offset code reduces a total peak current while performing counting of the image signal when multi-bit toggling is performed in one of the first and second counter groups. The method may further include compensating for the offset between the counts by the counters in the first counter group and the counts by the counters in the second counter group.

Using the offset code may include delaying the counter clock signal by a value of the offset code to obtain a delay clock signal, the counter clock signal being applied to the first counter group and the delay clock signal being applied to the second clock group while performing counting of the reset signal. The value of the offset code may indicate a number of periods of the counter clock signal corresponding to the delay of the counter clock signal to obtain the delay clock signal.

The offset code may include a counter setting signal, and using the offset code may include changing an initial count value of a count stored in counters of the first counter group. The counters in the first counting group may perform counting using the changed count value and the counters in the second counting group may perform counting using the initial count value.

BRIEF DESCRIPTION OF THE DRAWINGS

Illustrative embodiments will be more clearly understood from the following detailed description taken in conjunction with the accompanying drawings, in which:

FIGS. 12 through 13 are diagrams showing comparison between the comparison example in FIG. 6 and the embodiments of the inventive concept shown in FIGS. 7 and 10;

FIG. 14 is a diagram showing examples of using different offset codes, according to embodiments of the inventive concept.

DETAILED DESCRIPTION OF THE EMBODIMENTS

Figure 1:
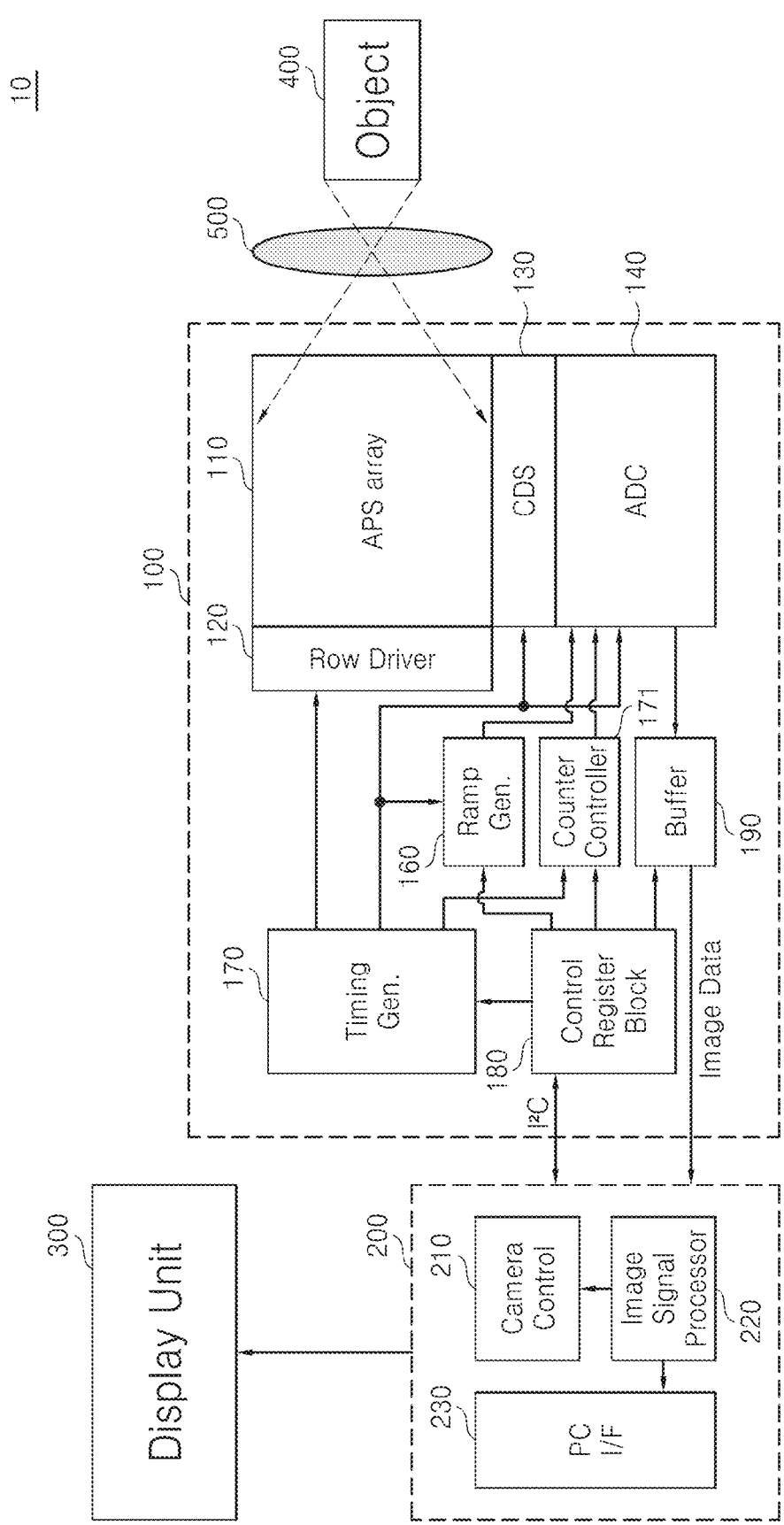
FIG. 1 is a block diagram of an image processing system, according to embodiments of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc., may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of an image processing system 10 according to embodiments of the inventive concept. In the depicted illustrative embodiment, the image processing system 10 includes an image sensor 100, an image processor (or a digital signal processor (DSP)) 200, a display unit 300, and a lens 500.

The image sensor 100 includes a pixel array (e.g., an active pixel sensor (APS) array) 110, a row driver 120, a correlated double sampling (CDS) block 130, an analog-to-digital converter (ADC) 140, a ramp generator 160, a timing generator 170, a counter controller 171, a control register block 180, and a buffer 190.

The image sensor 100 is controlled by the DSP 200 to sense an object 400 photographed through the lens 500. The DSP 200 may output an image, which has been sensed and output by the image sensor 100, to the display unit 300. The display unit 300 may be any device able to output an image. For instance, the display unit 300 may be a computer, a mobile phone, or any type of image display terminal.

The DSP 200 includes a camera control 210, an image signal processor 220, and a personal computer (PC) interface (I/F) 230. The camera control 210 controls the control register block 180. The camera control 210 may control the image sensor 100, and more specifically, the control register block 180 using an inter-integrated circuit ($I^2C$), but the scope of the inventive concept is not restricted thereto.

The image signal processor 220 receives image data, i.e., an output signal of the buffer 190, processes the image data into an image appealing for people to see, and outputs the image to the display unit 300 through PC I/F 230.

In the embodiment in FIG. 1, the image signal processor 220 is positioned within the DSP 200, although the design may be varied without departing from the scope of the present teachings, as would be apparent to those skilled in the art. For instance, the image signal processor 220 may be positioned alternatively within the image sensor 100.

The pixel array 110 includes multiple photo sensitive devices, such as photo diodes or pinned photo diodes. The pixel array 110 senses light using the photo sensitive devices and converts the light into an electrical signal to generate an image signal.

The timing generator 170 may output at least one of a control signal and a clock signal to the row driver 120, the CDS 130, the ADC 140, the ramp generator 160, and the counter controller 171 to control the operations or the timing of the row driver 120, the ADC 140, the ramp generator 160, and the counter controller 171. The control register block 180 may output a control signal to the ramp generator 160, the timing generator 170, the counter controller 171, and the buffer 190 to control the respective operations. The control register block 180 is controlled by the camera control 210.

The counter controller 171 may receive a control signal from the control register block 180 and transmit a counter control signal to multiple counters (indicted by representative counters 151 in FIG. 2) included in the ADC 140 to control operations of the counters 151. The counter control signal may include a counter reset signal (CNT_RST in FIG. 3) for controlling a reset operation of the counters 151, a counter setting signal (CNT_SET in FIG. 9) for changing an internal bit of the counters 151, and an inverting signal (IVS in FIG. 3) for inverting all internal bits of the counters 151. The counter controller 171 may receive a clock signal from the timing generator 170 and provide a counter clock signal (CNT_CLK in FIG. 3) and a delay clock signal (DEL_CNT_CLK in FIG. 4) to the counters 151.

The row driver 120 drives the pixel array 110 in units of rows. For instance, the row driver 120 may generate a row selection signal. The pixel array 110 outputs to the CDS block 130 a reset signal and an image signal from a row selected by the row selection signal received from the row driver 120. The CDS block 130 may perform CDS on the reset signal and the image signal.

The ADC 140 compares a ramp signal output from the ramp generator 160 with a CDS signal output from the CDS block 130, generates a comparison result signal, counts the comparison result signal, and outputs a count result to the buffer 190.

The buffer 190 temporarily stores a digital signal output from the ADC 140 and senses and amplifies the digital signal before outputting it. The buffer 190 may include multiple column memory blocks, e.g., static random access memories (SRAMs), provided for respective columns for temporal storing, and a sense amplifier provided for sensing and amplifying the digital signal received from the ADC 140.

Figure 2:
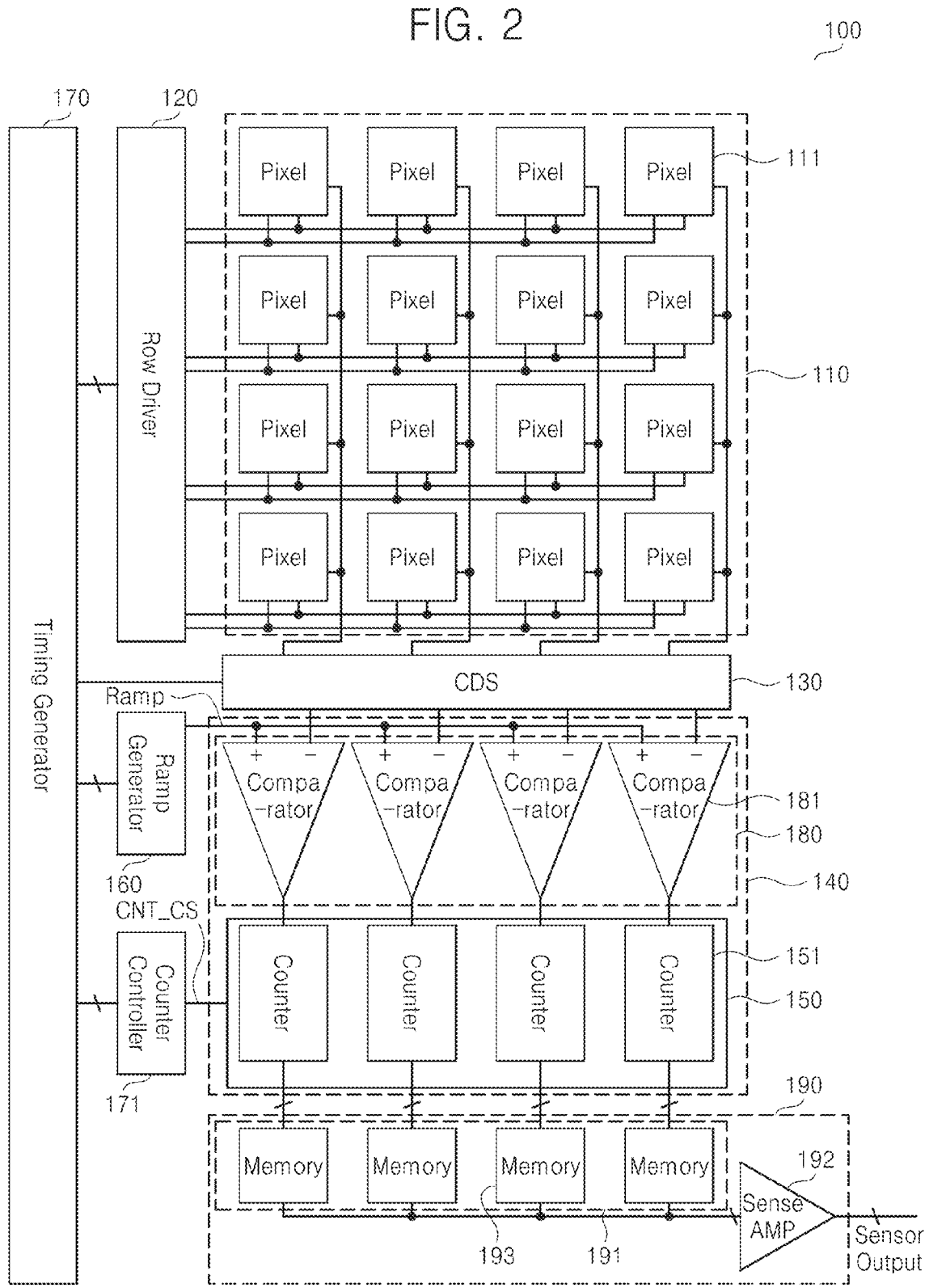
FIG. 2 is a block diagram of an image sensor, according to embodiments of the inventive concept.

FIG. 2 is a block diagram of the image sensor 100, according to embodiments of the inventive concept. Referring to FIG. 2, the image sensor 100 includes the pixel array 110, the row driver 120, the CDS block 130, the ADC 140, the ramp generator 160, the timing generator 170, the counter controller 171, and the buffer 190. The ADC 140 includes a comparison block 180 and a counter block 150.

The pixel array 110 includes multiple pixels 111 arranged in a matrix form, each of which is connected to one of multiple row lines and one of multiple column lines. The pixels 111 may include a red pixel which converts light in the red spectrum into an electrical signal, a green pixel which converts light in the green spectrum into an electrical signal, and a blue pixel which converts light in the blue spectrum into an electrical signal. In addition, a color filter (not shown) may be arrayed above each of the pixels 111 to transmit light in a particular spectrum.

The row driver 120 may decode a row control signal (e.g., an address signal) generated by the timing generator 170 and select at least one row line from among the row lines included in the pixel array 110 in response to a decoded row control signal. The CDS block 130 may perform CDS on a pixel signal output from a pixel connected to one of the column lines included in the pixel array 110.

The comparison block 180 includes multiple comparators 181, and inputs of each comparator 181 are connected with the CDS block 130 and the ramp generator 160, respectively. For example, the CDS block 130 may be connected to a first input terminal (e.g., inverting input) of the comparator 181 and the ramp generator 160 may be connected with a second input terminal (e.g., non-inverting input) of the comparator 181. Each comparator 181 compares an output signal of the CDS block 130 with a ramp signal Ramp received from the ramp generator 160, and outputs a comparison result signal from an output terminal. The comparison result signal output from the comparator 181 may correspond to a difference between an image signal varying with the luminance of external light and a reset signal. To output the difference between the image signal and the reset signal, the ramp signal Ramp is used, so that the difference between the image signal and the reset signal is picked up and output according to the slope of the ramp signal Ramp. The ramp generator 160 may operate based on a control signal generated by the timing generator 170.

The counter block 150 includes multiple counters 151. The counters 151 are respectively connected to the output terminals of the corresponding comparators 181, respectively. The counter controller 171 may generate and transmit a counter control signal CNT_CS to the counter block 150. The counter control signal CNT_CS may include a counter clock signal CNT_CLK, a delay clock signal DEL_CNT_CLK for delaying the timing of the counter clock signal CNT_CLK, and a counter setting signal CNT_SET for changing a particular internal bit of the counters 151. The counter block 150 counts the comparison result signals based on the counter clock signal CNT_CLK received from the counter controller 171 and outputs a digital signal corresponding to a count result. The counter controller 171 is positioned outside the timing generator 170 in FIGS. 1 and 2, although embodiments of the inventive concept are not restricted to this configuration. For example, the counter controller 171 may be positioned within the counter block 150 or the timing generator 170.

The counter 151 may be an up/down counter or a bit-wise inversion counter, for example. The bit-wise inversion counter may carry out a similar operation to the up/down counter. For instance, the bit-wise inversion counter may have a function of performing only up-counting and a function of inverting all bits therewithin to make them into 1's complements. Therefore, the bit-wise inversion counter may perform reset counting and invert a result of the reset counting, so that the result is converted into 1's complement, i.e., a negative value.

Each of the counters 151 may change a particular internal bit therewithin according to the counter setting signal CNT_SET output from the counter controller 171. The counter controller 171 may include a switch (not shown), for example, to provide the counter setting signal CNT_SET to only some of the counters 151. Alternatively, the switch may be positioned within the counters 151.

The buffer 190 includes a column memory block 191 and a sense amplifier 192. The column memory block 191 includes multiple memories 193. Each memory 193 may operate in response to a memory control signal generated by a memory controller (not shown) positioned within the column memory block 191 or the timing generator 170 based on a control signal generated by the timing generator 170. Each memory 193 may be an SRAM, for example. In response to the memory control signal, the column memory block 191 temporarily stores a digital signal output from each of the counters 151 and then outputs it to the sense amplifier 192. The sense amplifier 192 senses and amplifies the digital signal before outputting it.

Figure 3:
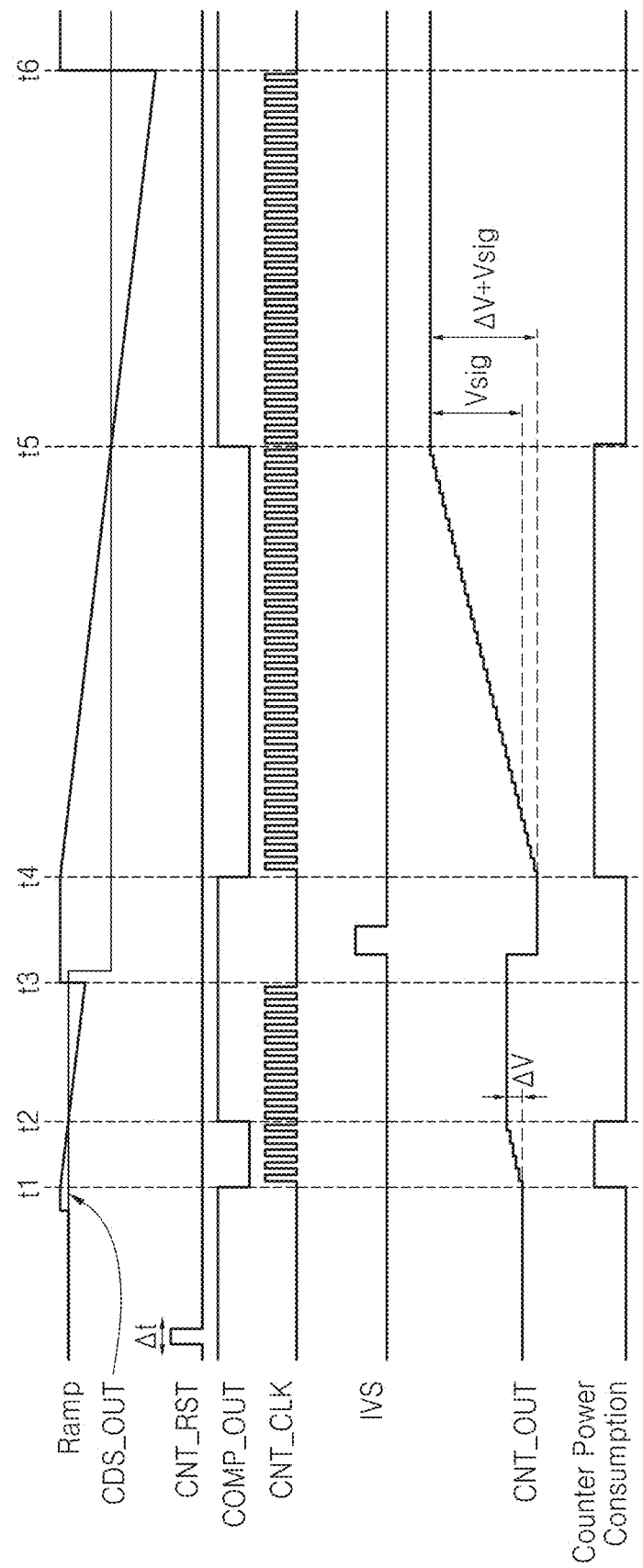
FIG. 3 is a timing diagram depicting illustrative waveforms of signals for explaining operation of an image sensor, according to embodiments of the inventive concept.

FIG. 3 is a timing diagram depicting illustrative waveforms of signals for explaining operation of the image sensor, according to embodiments of the inventive concept. Generally, when converting an analog pixel signal sensed from each pixel 111 into a digital signal, for example, the ADC 140 determines a point at which a value of the ramp signal Ramp, which decreases with a predetermined slope, is the same as a value of the pixel signal from the pixel 111 by comparing the ramp signal Ramp with the pixel signal. In more detail, the ADC 140 counts from a first point t1 where the ramp signal Ramp is generated (i.e., a point at which the ramp signal Ramp starts decreasing) to a second point t2 where the ramp signal Ramp has the same value as the pixel signal and obtains a count result corresponding to the magnitude of the pixel signal. The pixel signal is output from a column line and has a reset component $\Delta V$ first and then an image signal component Vsig. The count result may be a number obtained when the counting of the pixel signal is completed while a count value is a number obtained until the counting is completed.

Referring to FIG. 3, the counter reset signal CNT_RST received from the counter controller 171 is active (e.g., at a high level) for a predetermined period of time $\Delta t$ to reset the count value of the counter block 150. The ramp signal Ramp generated by the ramp generator 160 is input to each of the comparators 181, which compares a voltage of the ramp signal Ramp with a voltage of an output signal CDS_OUT (e.g., a pixel signal) of the CDS block 130 (hereinafter, referred to as the CDS output signal CDS_OUT), which is received from a column line corresponding to the comparator 181.

For the first reading, the comparator 181 inverts a comparison result signal COMP_OUT from a high level to a low level during a period from the first point t1 when the ramp signal Ramp starts decreasing to the second point t2 when the ramp signal Ramp is equal to the CDS output signal CDS_OUT. The counter block 150 stops counting at the second point t2 when the comparison result signal COMP_OUT of the comparator 181 is inverted and latches a count value at the second point t2 as data. Consequently, counting is performed during the period from the first point t1 to the second point t2, during which the counter block 150 consumes power.

The counter clock signal CNT_CLK is input to the counter block 150 and is toggled starting from the first point t1 when the ramp signal Ramp starts decreasing to a last decreasing point, i.e., a third point t3, and the ramp signal Ramp is again set greater than the CDS output signal CDS_OUT. In other words, after the third point t3, the input of the counter clock signal CNT_CLK to the counter block 150 is halted.

Consequently, counting of a count result CNT_OUT of the counter block 150 starts when the ramp signal Ramp is generated (e.g., when the ramp signal Ramp starts decreasing) at the first point t1, and a clock signal is counted until the second point t2 when an inverted output signal is obtained after comparison is carried out by the comparison block 180, so that a count value corresponding to the voltage $\Delta V$ of a reset signal is obtained.

After the first reading is completed and before a second reading starts, the counter block 150 may convert the value of the count result CNT_OUT into a negative value having the same absolute value as the count value in response to an inverting signal IVS received from the counter controller 171. This operation is performed to obtain the image signal component Vsig as a result of the second reading after the reset component $\Delta V$ is eliminated.

In the second reading, the image signal component Vsig generated in each pixel 111 according to the quantity of incident light is read. The second reading may be performed in the same manner as the first reading.

The comparator 181 inverts the comparison result signal COMP_OUT from the high level to the low level starting from a fourth point t4 when the ramp signal Ramp starts decreasing until a fifth point t5 where the ramp signal Ramp is equal to the CDS output signal CDS_OUT. The counter block 150 stops counting at the fifth point t5 when the comparison result signal COMP_OUT of the comparator 181 is inverted and latches a count value obtained at the fifth point t5 as data. Consequently, the counting is performed during a period from the fourth point t4 to the fifth point t5, during which the counter block 150 consumes power.

The counter clock signal CNT_CLK is input to the counter block 150 and is toggled starting from the fourth point t4 when the ramp signal Ramp starts decreasing to a last decreasing point, i.e., a sixth point t6. In other words, after the sixth point t6, the input of the counter clock signal CNT_CLK to the counter block 150 is halted. The sixth point t6 may be the last point of the ramp signal Ramp, i.e., the last decreasing point.

Consequently, the counting of the count result CNT_OUT of the counter block 150 starts at the fourth point t4 when the ramp signal Ramp is generated (e.g., when the ramp signal Ramp starts decreasing) and the counter clock signal CNT_CLK is counted up to the fifth point t5 when an inverted comparison result signal COMP_OUT is obtained after comparison is carried out by the comparison block 180, so that a count value corresponding to the image signal component Vsig is obtained, after the reset component $\Delta V$ is removed. In other words, after the first reading, the count result CNT_OUT value of the counter block 150 becomes a negative value having the absolute value of the reset component $\Delta V$ in response to the inverting signal IVS. In the second reading, the counter block 150 starts counting from the negative value having the absolute value of the reset component $\Delta V$, and is therefore effectively a subtraction operation. The count result CNT_OUT obtained through such subtraction may be kept in the counter block 150 as an n-bit digital value.

Consequently, the count result CNT_OUT is a digital value corresponding to the formula $(\Delta V+Vsig)+(-\Delta V)=Vsig$. In the depicted embodiment, the reset component $\Delta V$ is eliminated by the inverting signal IVS in the embodiments illustrated in FIG. 3. Alternatively, down-counting may be performed for the reset signal and up-counting may be performed for the image signal, for example, to obtain the same result. The counting may be performed vice versa, as well.

As illustrated in FIG. 3, power consumption of the counter block 150 occurs during the period from the first point t1 to the second point t2 and the period from the fourth point t4 to the fifth point t5. In particular, large peak current may suddenly occur at a particular point during the counting.

For instance, when each counter 151 can store a total of 8 bits and the count value increases from 127 to 128 (i.e., from 00111111 to 01000000 in a binary number system), seven bits may be toggled at a time. When the count value increases from 255 to 256 (i.e., from 01111111 to 1000000), eight bits may be toggled at a time. Notably, a total of eight bits stored by each counter 151 is just an example, and the inventive concept is not restricted to this number of bits. When multiple bits are toggled simultaneously, and in particular, when multiple bits in each of the counters 151 are toggled at the same time, very high peak current occurs, which may cause deterioration of pixel data quality or malfunction of the system. Accordingly, in embodiments of the inventive concept, the counters 151 are divided into multiple groups and signals input to each group are controlled, so that peak current is reduced.

Figure 4:
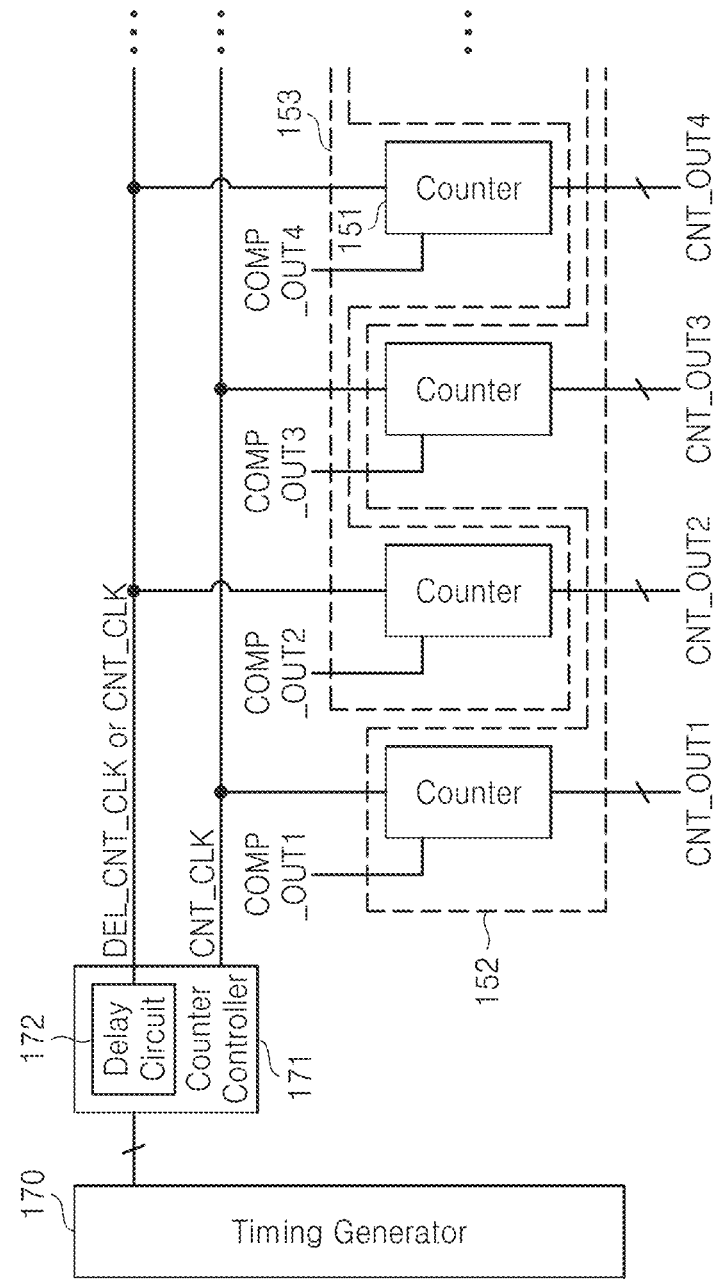
FIG. 4 is a block diagram for explaining the operations of a counter controller and an analog-to-digital converter (ADC) in an image sensor, according to embodiments of the inventive concept.

FIG. 4 is a block diagram for explaining operations of the counter controller 171 and the ADC 140, according to embodiments of the inventive concept. Referring to FIGS. 1 through 4, the counters 151 may be divided into a first counter group 152 and a second counter group 153. In the embodiment illustrated in FIG. 4, odd-numbered counters 151 from the left are grouped into the first counter group 152 and even-numbered counters 151 from the left are grouped into the second counter group 153. This configuration is just an example, and the counters 151 may be grouped in various other ways without departing from the scope of the present teachings. Also, although the counters 151 are shown divided into the two counter groups 152 and 153, they generally may be divided into "n" groups where "n" is equal to 2 or a natural number greater than 2.

The counter controller 171 receives a clock signal from the timing generator 170, and generates and transmits the counter clock signal CNT_CLK and the delay clock signal DEL_CNT_CLK to the first and second counter groups 152 and 153, respectively. The delay clock signal DEL_CNT_CLK corresponds to a clock signal obtained by delaying the counter clock signal CNT_CLK by an offset code. Stated generally, the counters 151 are divided into "n" groups, i.e., at least two groups, and the counter controller 171 generates (n−1) delay clock signals DEL_CNT_CLK by delaying the counter clock signal CNT_CLK by different offset codes, respectively. The counter controller 171 may then transmit the delay clock signals DEL_CNT_CLK to second through n-th counter groups, respectively (but does not transmit the delay clock signals DEL_CNT_CLK to the first counter group).

The offset code may be a value by which the counter clock signal CNT_CLK is delayed in the time domain. The value of the offset code indicates the number of periods of the counter clock signal CNT_CLK corresponding to the delay. For instance, when the offset code is five, the delay clock signal DEL_CNT_CLK is generated by delaying the counter clock signal CNT_CLK by five clock periods. The offset code may be determined by a central processing unit (CPU) (not shown) included in the counter controller 171 or determined according to a counter control signal received from the control register block 180, for example.

In the depicted embodiment, the counter controller 171 includes a delay circuit 172. The delay circuit 172 receives the counter clock signal CNT_CLK and delays it by the offset code to generate the delay clock signal DEL_CNT_CLK. Each of the counters 151 in the first counter group 152 receives the counter clock signal CNT_CLK and a comparison result signal COMP_OUT1 or COMP_OUT3 output from a comparator 181 connected to a column line. Each counter 151 in the first counter group 152 may perform counting during a period while the comparison result signal COMP_OUT1 or COMP_OUT3 is at a low level and output a digital signal CNT_OUT1 or CNT_OUT3 corresponding to a count result.

Similarly, each of the counters 151 in the second counter group 153 receives the delay clock signal DEL_CNT_CLK and a comparison result signal COMP_OUT2 or COMP_OUT4 output from a comparator 181 connected to a column line. Each counter 151 in the second counter group 153 may perform counting during a period while the comparison result signal COMP_OUT2 or COMP_OUT4 is at a low level and output a digital signal CNT_OUT2 or CNT_OUT4 corresponding to a count result.

Figure 5:
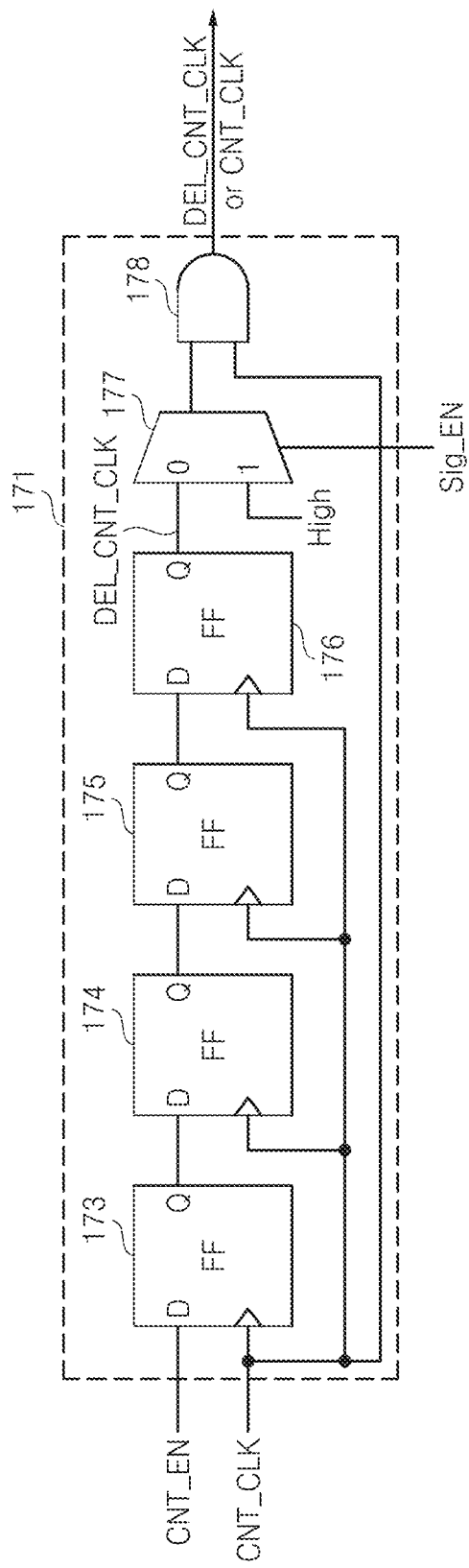
FIG. 5 is a block diagram for explaining operations of a delay circuit in detail, according to embodiments of the inventive concept.

FIG. 5 is a block diagram for explaining operations of the delay circuit 172 in detail, according to embodiments of the inventive concept. Referring to FIGS. 1 through 5, the delay circuit 172 includes illustrative first through fourth flip-flops 173 through 176, a multiplexer (MUX) 177, and an AND gate 178.

The first through fourth flip-flops 173 through 176 may be connected in series to one another and may be D flip-flops, for example. The first flip-flop 173 may receive a count enable signal CNT_EN and the counter clock signal CNT_CLK. The count enable signal CNT_EN may be synchronized with the comparison result signal COMP_OUT output from the comparators 181, and therefore be at a high level when the comparison result signal COMP_OUT is at the low level and at a low level when the comparison result signal COMP_OUT is at the high level.

Due to operation of the first through fourth flip-flops 173 through 176, a delay clock signal DEL_CNT_CLK generated at an output terminal of the fourth flip-flop 176 lags behind the counter clock signal CNT_CLK by three clock periods. The MUX 177 receives the delay clock signal DEL_CNT_CLK and a high-level signal always having logic "1". The MUX 177 also receives an image signal count enable signal Sig_EN as a selection signal. The image signal count enable signal Sig_EN may be at a high level when the comparison result signal COMP_OUT with respect to an image signal is input from the comparators 181 to the counter block 150.

Accordingly, until the comparison result signal COMP_OUT with respect to the image signal is input to the counter block 150, the delay clock signal DEL_CNT_CLK may be output from the MUX 177. After the comparison result signal COMP_OUT with respect to the image signal is input to the counter block 150, the high-level signal may be output from the MUX 177, instead of the delay clock signal DEL_CNT_CLK.

The AND gate 178 receives the counter clock signal CNT_CLK and an output signal of the MUX 177. Accordingly, while the delay clock signal DEL_CNT_CLK is output from the MUX 177, an output of the AND gate 178 may be the delay clock signal DEL_CNT_CLK. While the high-level signal is output from the MUX 177, the output of the AND gate 178 may be the counter clock signal CNT_CLK. Consequently, the delay circuit 172 may generate the delay clock signal DEL_CNT_CLK lagging behind the counter clock signal CNT_CLK by the offset code (i.e., three in FIG. 5), and transmit the delay clock signal DEL_CNT_CLK to the counters 151 in the second counter group 153 while the counters 151 in the second counter group 153 perform counting on a reset signal.

The delay circuit 172 illustrated in FIG. 5 is an example, and the design may be varied without departing from the scope of the present teachings, as would be apparent to those skilled in the art. The offset code may vary with the number of flip-fops in the delay circuit 172 or may be changed using a switch (not shown). The delay circuit 172 may also include an inverter (not shown) to prevent time delay occurring due to flip-flop operation.

Figure 6:
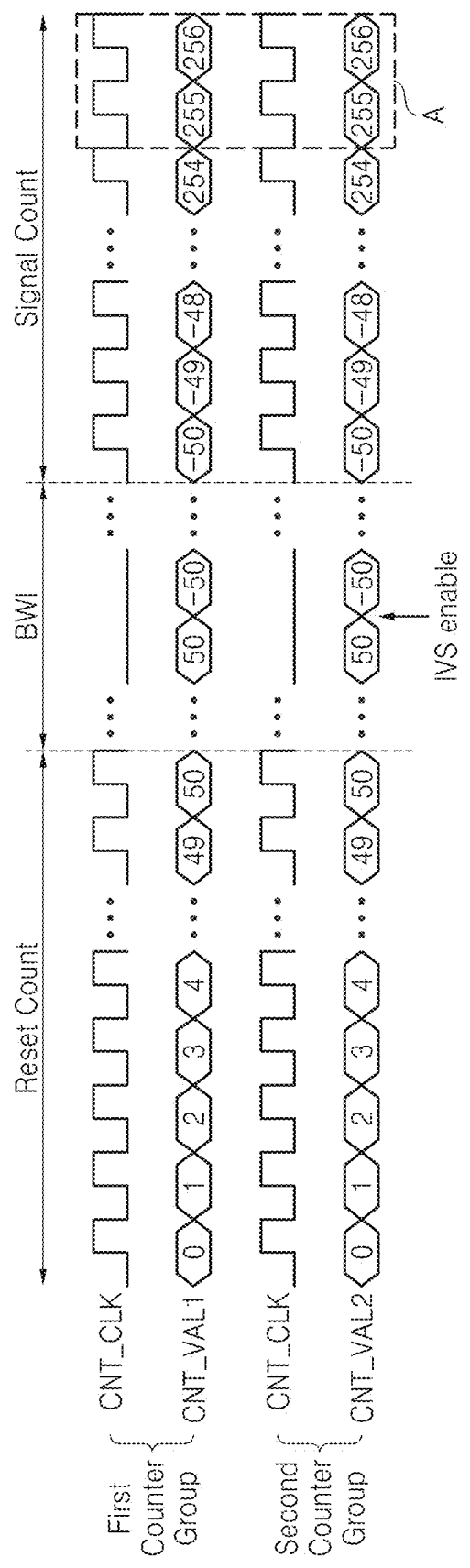
FIG. 6 is a timing chart showing illustrative operations of an ADC for purposes of comparison.

FIG. 6 is a timing chart showing operations of an ADC as an example for purposes of comparison with FIG. 7 below. Referring to FIGS. 1 through 6, the counters 151 of the counter block 150 are divided into the first counter group 152 and the second counter group 153, both of which perform counting according to the counter clock signal CNT_CLK. In other words, in the depicted example, the second counter group 153 does not perform counting according to the delay clock signal DEL_CNT_CLK. The first and second counter groups 152 and 153 receive the counter reset signal CNT_RST from the counter controller 171 and respectively reset count values CNT_VAL1 and CNT_VAL2 to zero.

The first and second counter groups 152 and 153 perform counting of a reset signal while the comparison result signals COMP_OUT1 through COMP_OUT4 received from the comparators 181 are at the low level, that is, during a reset count period for the reset signal, and complete the counting when the count values CNT_VAL1 and CNT_VAL2 are 50, for example. In the following BWI (Bit Wise Inversion) period, when the inverting signal IVS received from the counter controller 171 is enabled, the first and second counter groups 152 and 153 change the count values CNT_VAL1 and CNT_VAL2 stored therein into negative values having the same absolute value as the count values CNT_VAL1 and CNT_VAL2. In other words, when the inverting signal IVS is enabled, the count values CNT_VAL1 and CNT_VAL2 are changed from 50 to −50.

The first and second counter groups 152 and 153 perform counting of an image signal while the comparison result signals COMP_OUT1 through COMP_OUT4 received from the comparators 181 are newly at the low level, that is, during a signal count period for the image signal. The first and second counter groups 152 and 153 perform the counting of the image signal starting from −50 and incrementally increase the count values CNT_VAL1 and CNT_VAL2 by one. When the count values CNT_VAL1 and CNT_VAL2 are increased from 255 to 256 (i.e., from 011111111 to 10000000), indicated by block A, eight bits in every counter 151 in the first and second counter groups 152 and 153 are simultaneously toggled. Accordingly, very high peak current occurs at this time, so that the quality of pixel data may deteriorate or a system may malfunction. The high peak current may also occur in the reset count period as well.

Figure 7:
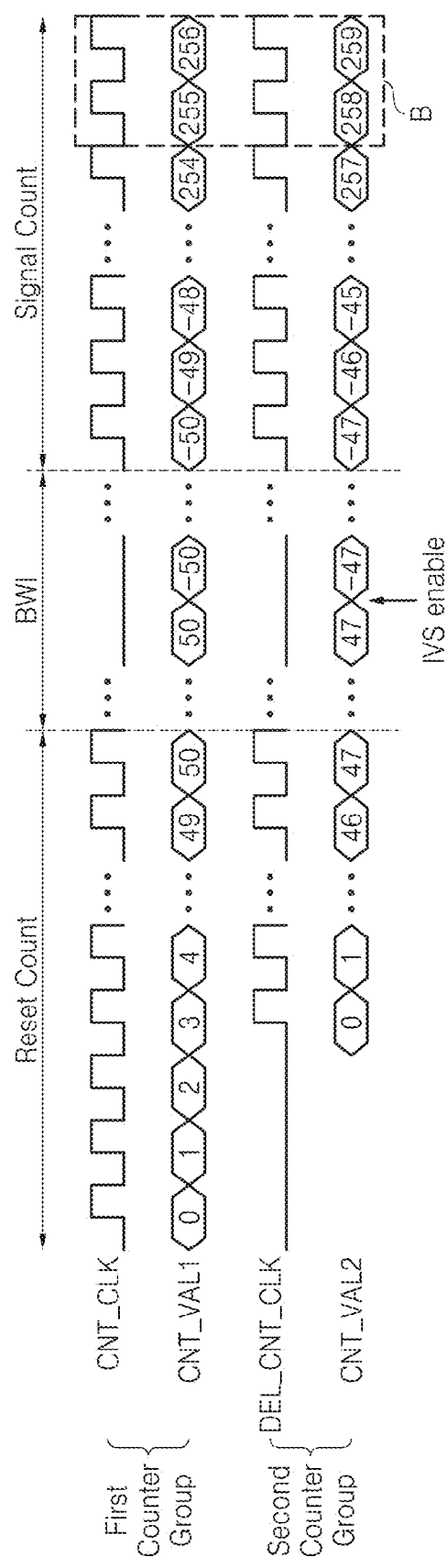
FIG. 7 is a timing chart showing the operations of an ADC, according to embodiments of the inventive concept.

In comparison, FIG. 7 is a timing chart showing operations of the ADC 140, according to embodiments of the inventive concept, using delay clock signal DEL_CNT_CLK. Referring to FIGS. 1 through 7, the counters 151 of the counter block 150 are divided into the first counter group 152, which performs counting according to the counter clock signal CNT_CLK, and the second counter group 153, which performs counting according to the delay clock signal DEL_CNT_CLK. The first and second counter groups 152 and 153 may receive the counter reset signal CNT_RST from the counter controller 171 and respectively reset count values CNT_VAL1 and CNT_VAL2 to zero.

The first and second counter groups 152 and 153 perform counting of a reset signal while the comparison result signals COMP_OUT1 through COMP_OUT4 received from the comparators 181 are at the low level, that is, during the reset count period for the reset signal. In the embodiments illustrated in FIG. 7, the delay clock signal DEL_CNT_CLK lags behind the counter clock signal CNT_CLK by an offset code of three. In other words, the clock pulse of the delay clock signal DEL_CNT_CLK input to the second counter group 153 starts three clock periods after the clock pulse of the counter clock signal CNT_CLK input to the first counter group 152 starts.

When the comparison result signals COMP_OUT1 through COMP_OUT4 transit to the high level, the first and second counter groups 152 and 153 terminate the counting of the reset signal. Referring to FIG. 7, the first counter group 152 terminates the counting when the count value CNT_VAL1 is 50 while the second counter group 153 terminates the counting when the count value CNT_VAL2 is 47.

In the following BWI (Bit Wise Inversion) period, when the inverting signal WS received from the counter controller 171 is enabled, the first and second counter groups 152 and 153 change the count values CNT_VAL1 and CNT_VAL2 stored therein into negative values having the same absolute values as the count values CNT_VAL1 and CNT_VAL2, respectively. In other words, when the inverting signal IVS is enabled, the count value CNT_VAL1 of the first counter group 152 is changed from 50 to −50 and the count value CNT_VAL2 of the second counter group 153 is changed from 47 into −47.

While the comparison result signals COMP_OUT1 through COMP_OUT4 received from the comparators 181 are newly at the low level, that is, during the signal count period for an image signal, the image signal count enable signal Sig_EN is at the high level, so that the counter clock signal CNT_CLK may be input to both of the first and second counter groups 152 and 153. The first counter group 152 may perform the counting of the image signal starting from −50 and incrementally increase the count value CNT_VAL1 by one. The second counter group 153 may perform the counting of the image signal starting from −47 and incrementally increase the count value CNT_VAL2 by one. Accordingly, thereafter, the count value CNT_VAL1 of the first counter group 152 is less than the count value CNT_VAL2 of the second counter group 153 by three.

As indicated by block B in FIG. 7, the count value CNT_VAL1 of the first counter group 152 is increased from 255 to 256 (i.e., from 011111111 to 10000000) and the count value CNT_VAL2 of the second counter group 153 is increased from 258 to 259 (i.e., from 10000010 to 10000011). Accordingly, while eight bits in every counter 151 in the first counter group 152 are simultaneously toggled, only one bit in every counter 151 in the second counter group 153 is toggled at that time.

Unlike the ADC in the comparison example illustrated in FIG. 6, the ADC 140 according to the current embodiments has fewer bits toggled at a time. As a result, peak current may be very low as compared to the comparison example in FIG. 6.

Although only the transitions in block B are illustrated in FIG. 7, the reduction in peak current may also occur in other blocks where multiple bits are simultaneously toggled in the reset count period. For example, when the count value CNT_VAL1 or CNT_VAL2 is changed from 127 to 128, peak current is also be reduced since these transitions do not occur at the same time.

Generally, according to embodiments of the inventive concept described above, the image sensor 100 divides the counters 151 into multiple groups, and applies different counter clock signals to the different groups, thereby reducing peak current occurring in the counters 151.

Figure 8:
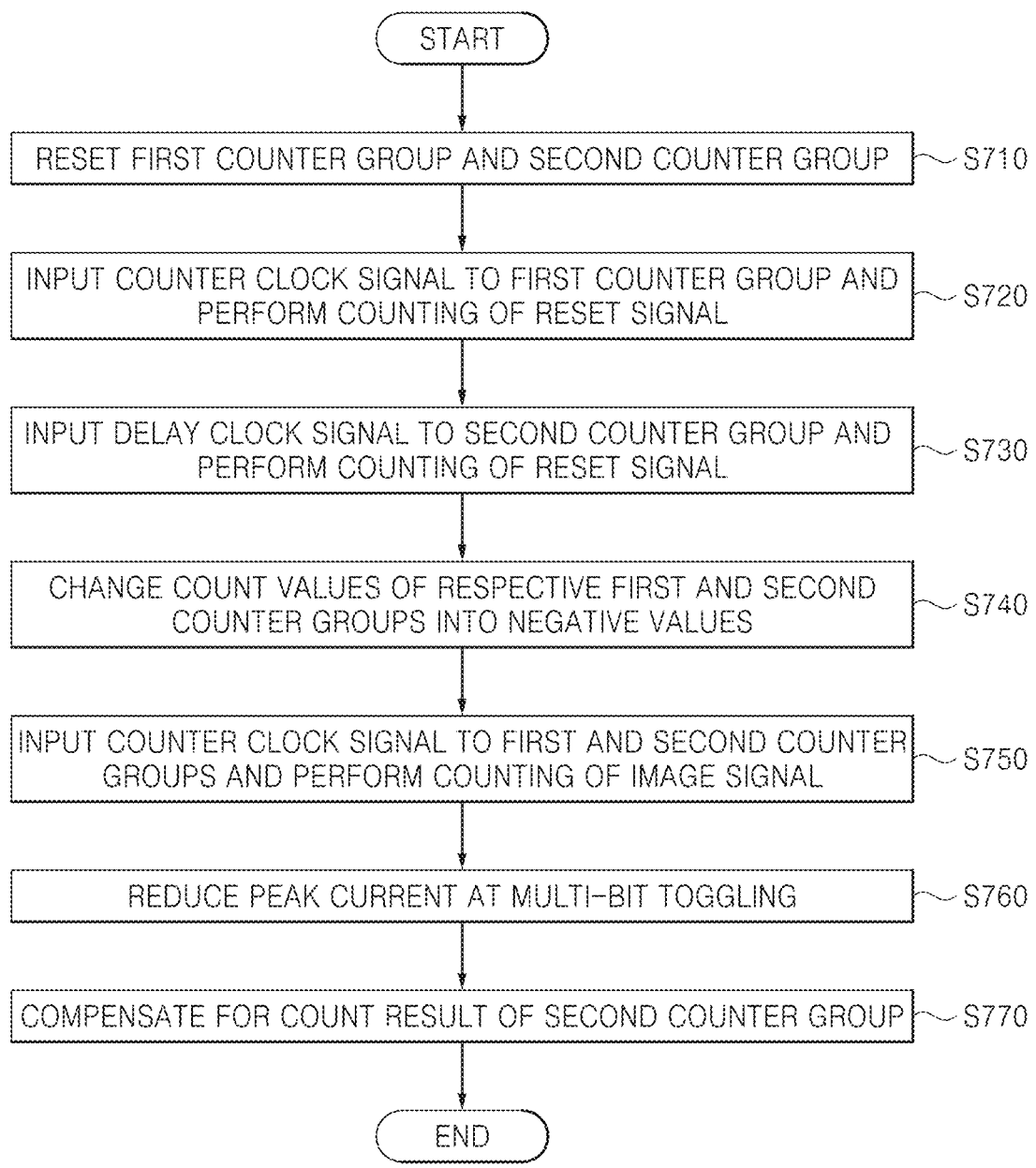
FIG. 8 is a flowchart showing operations of the ADC corresponding to FIG. 7, according to embodiments of the inventive concept.

FIG. 8 is a flowchart showing operations of the ADC 140 illustrated in FIG. 7. Referring to FIGS. 1 through 8, the first and second counter groups 152 and 153 included in the counter block 150 of the ADC 140 receive the counter reset signal CNT_RST from the counter controller 171 and reset the count values CNT_VAL1 and CNT_VAL2 respectively stored therein in operation S710. The count values CNT_VAL1 and CNT_VAL2 may be reset to zero, for example.

The first counter group 152 receives the counter clock signal CNT_CLK from the counter controller 171 and performs counting of a reset signal in the reset count period in operation S720. The second counter group 153 receives the delay clock signal DEL_CNT_CLK from the counter controller 171 via the delay circuit 172 and performs counting of the reset signal in the reset count period in operation S730. For instance, as described with reference to FIG. 7, the first counter group 152 may immediately start the counting of the reset signal from zero, while the second counter group 153 is delayed for three counts, for example, and thus may start the counting of the reset signal from zero when the count of the first counter group 152 is at three. The delay clock signal DEL_CNT_CLK is a clock signal that lags behind the counter clock signal CNT_CLK by an offset code, which has a value of three in this example.

In the BWI (Bit Wise Inversion) period after the counting of the reset signal is completed, when the inverting signal IVS received from the counter controller 171 is enabled, the first and second counter groups 152 and 153 change the count value CNT_VAL1 stored in the counters 151 in the first counter group 152 and the count value CNT_VAL2 stored in the counters 151 in the second counter group 153 into negative values having the same absolute values as the count values CNT_VAL1 and CNT_VAL2, respectively, in operation S740.

Thereafter, when an image signal is received, the delay circuit 172 may output the counter clock signal CNT_CLK instead of the delay clock signal DEL_CNT_CLK. Accordingly, both of the first and second counter groups 152 and 153 receive the counter clock signal CNT_CLK and perform counting of the image signal in operation S750, beginning from the respective stored count values CNT_VAL1 and CNT_VAL2.

In the reset count period or the signal count period, and more particularly, when multiple bits in either of the counters 151 in the first counter group 152 or the second counter group 153 are simultaneously toggled, for example, in block B of FIG. 7, peak current may be reduced in operation S760 (as compared to a counting operation that does not use the delay clock signal DEL_CNT_CLK, e.g., as shown in FIG. 6).

The second counter group 153 receiving the delay clock signal DEL_CNT_CLK has an error as much as the offset code, as compared when the counting is performed using the counter clock signal CNT_CLK. Accordingly, a count result of the second counter group 153 may be compensated by the offset code in operation S770. For instance, when the delay clock signal DEL_CNT_CLK with an offset code of three is applied to the second counter group 153, the count result of the second counter group 153 may be increased by three for compensation. Such compensation may be performed by the counter setting signal CNT_SET received from the counter controller 171 or by a control signal of a memory controller (not shown) controlling the column memory block 191.

Figure 9:
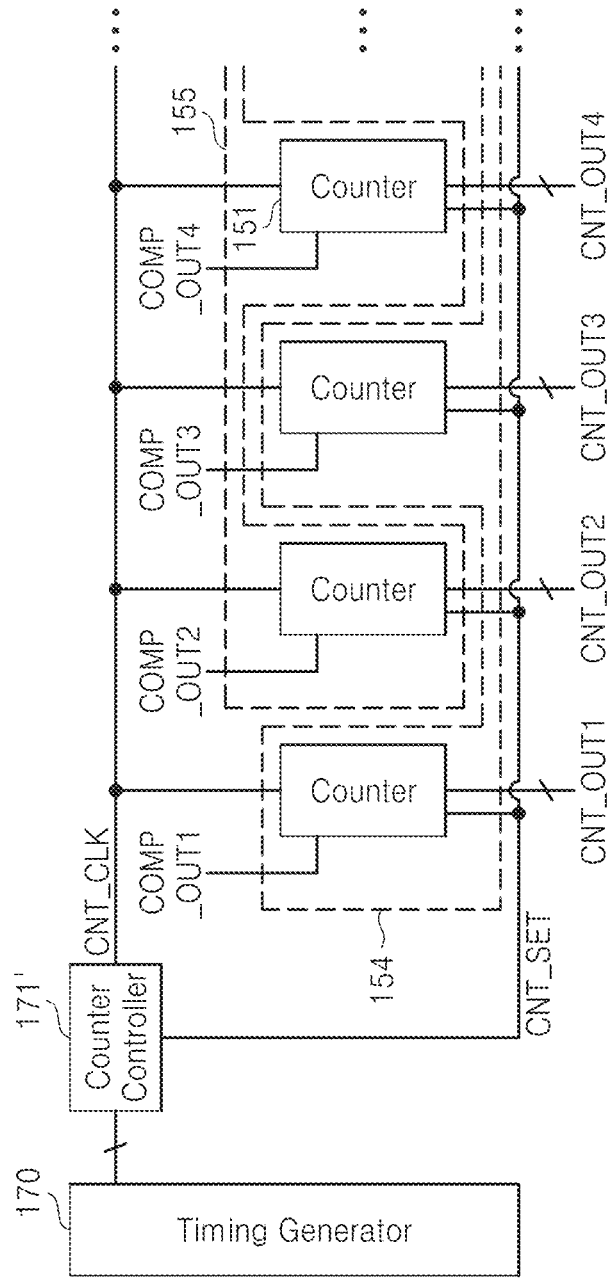
FIG. 9 is a block diagram for explaining operations of a counter controller and an ADC, according to embodiments of the inventive concept.

FIG. 9 is a block diagram for explaining operations of a counter controller 171' and the ADC 140, according to embodiments of the inventive concept. Referring to FIGS. 1 through 9, overall operation of the counter controller 171' and the ADC 140 illustrated in FIG. 9 is similar to that of the counter controller 171 and the ADC 140 illustrated in FIG. 4, and therefore the description of FIG. 9 will focus on differences between the embodiments.

Similar to the embodiments illustrated in FIG. 4, the counters 151 in the counter block 150 may be divided into a first group 154 and a second group 155. The counter controller 171' may receive a clock signal from the timing generator 170, and transmit the counter clock signal CNT_CLK to both of the first and second counter groups 154 and 155. Accordingly, unlike the embodiments illustrated in FIG. 4, both of the first and second counter groups 154 and 155 may receive the counter clock signal CNT_CLK.

The counter controller 171' may generate the counter setting signal CNT_SET and transmit it only to the first counter group 154. The counter setting signal CNT_SET may change a particular bit in the counters 151 in the first counter group 154 receiving the counter setting signal CNT_SET, so that a count value CNT_VAL stored in the counters 151 is increased or decreased by an offset code. For instance, when a counter 151 is reset by the counter reset signal CNT_RST, the count value CNT_VAL stored in the counter 151 may be zero (or "00000000" in the binary number system). When the counter 151 receives the counter setting signal CNT_SET with an offset code of three, for example, the counter 151 toggles two bits therein in response to the counter setting signal CNT_SET to change the count value CNT_VAL from zero to three (or "00000011").

The counters 151 in the first and second counter groups 154 and 155 may receive the counter clock signal CNT_CLK and the comparison result signals COMP_OUT1 through COPM_OUT4, respectively, connected to respective column lines. The counters 151 in the first and second counter groups 154 and 155 may perform counting during a period while the comparison result signals COMP_OUT1 through COPM_OUT4 are at the low level and output the digital signals CNT_OUT1 through CNT_OUT4, respectively, corresponding to count results.

Figure 10:
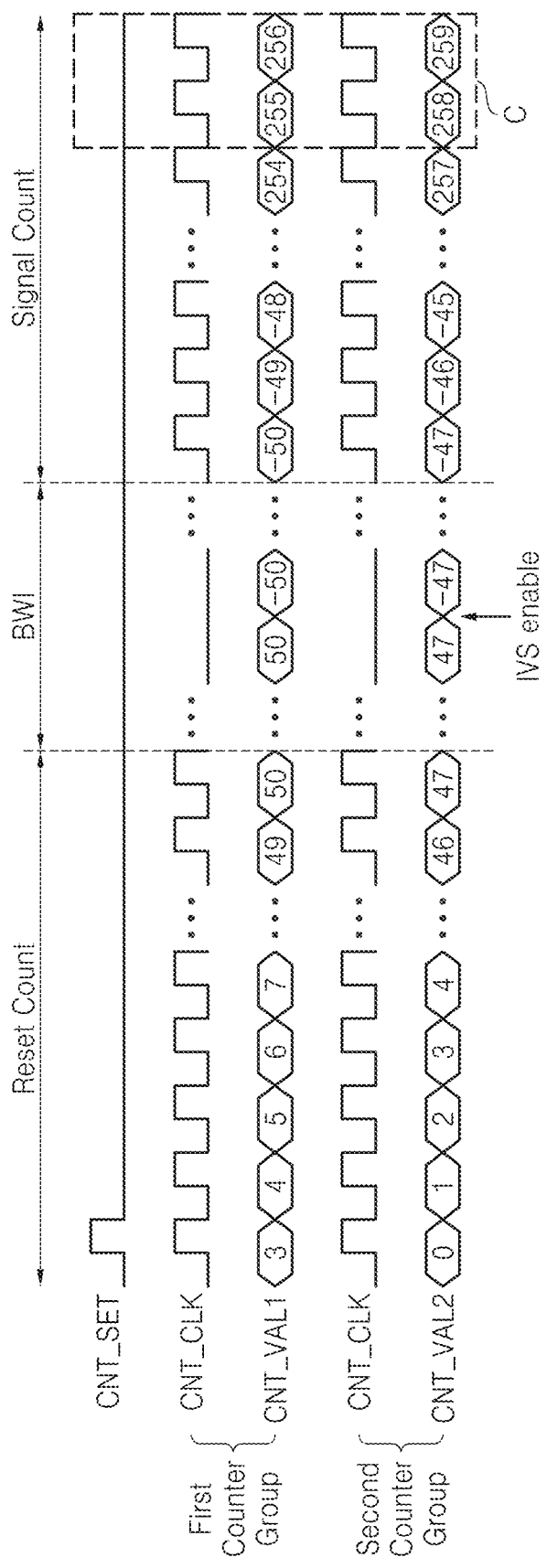
FIG. 10 is a timing chart showing operations of an ADC, according to embodiments of the inventive concept.

FIG. 10 is a timing chart showing operations of the ADC 140, according to embodiments of the inventive concept. Referring to FIGS. 1 through 10, the counters 151 of the counter block 150 are divided into the first counter group 154 and the second counter group 155, as discussed above, both of which perform counting according to the counter clock signal CNT_CLK. The first and second counter groups 154 and 155 may receive the counter reset signal CNT_RST from the counter controller 171' and respectively reset count values CNT_VAL1 and CNT_VAL2 to zero.

In addition, the counter controller 171' may generate and transmit the counter setting signal CNT_SET only to the first counter group 154. The counter setting signal CNT_SET may transit to a high level after the counters 151 in the first counter group 154 are reset. The counters 151 in the first counter group 154, which receive the counter setting signal CNT_SET with an offset code of three, for example, may change two bits therein to increase the count value CNT_VAL1 stored in the counters 151 by the offset code, e.g., three, before counting starts.

The first and second counter groups 154 and 155 may perform counting of a reset signal while the comparison result signals COMP_OUT1 through COMP_OUT4 received from the comparators 181 are at the low level, that is, during the reset count period for the reset signal. In the embodiments illustrated in FIG. 10, the first counter group 154 may perform the counting of the reset signal starting from three and the second counter group 155 may perform the counting of the reset signal starting from zero.

When the comparison result signals COMP_OUT1 through COMP_OUT4 transit to the high level, the first and second counter groups 154 and 155 may terminate the counting of the reset signal. Referring to FIG. 10, the first counter group 154 may terminate the counting when the count value CNT_VAL1 is 50 and the second counter group 155 may terminate the counting when the count value CNT_VAL2 is 47.

In the following BWI (Bit Wise Inversion) period, when the inverting signal WS received from the counter controller 171' is enabled, the first and second counter groups 154 and 155 change the count values CNT_VAL1 and CNT_VAL2 stored therein into negative values having the same absolute values as the count values CNT_VAL1 and CNT_VAL2, respectively. In other words, when the inverting signal IVS is enabled, the count value CNT_VAL1 of the first counter group 154 is changed from 50 to −50 and the count value CNT_VAL2 of the second counter group 155 is changed from 47 into −47.

While the comparison result signals COMP_OUT1 through COMP_OUT4 received from the comparators 181 are newly at the low level, that is, during the signal count period for an image signal, the image signal count enable signal Sig_EN is at the high level, so that the counter clock signal CNT_CLK is input to the first and second counter groups 154 and 155. The first counter group 154 performs the counting of the image signal starting from −50 and incrementally increases the count value CNT_VAL1 by one. The second counter group 155 performs the counting of the image signal starting from −47 and incrementally increases the count value CNT_VAL2 by one. Accordingly, thereafter, the count value CNT_VAL1 of the first counter group 154 is greater than the count value CNT_VAL2 of the second counter group 155 by three.

As indicated in block C of FIG. 10, the count value CNT_VAL1 of the first counter group 154 is increased from 255 to 256 (i.e., from 01111111 to 10000000) and the count value CNT_VAL2 of the second counter group 155 is increased from 258 to 259 (i.e., from 10000010 to 10000011). Accordingly, while eight bits in every counter 151 in the first counter group 154 are simultaneously toggled, only one bit in every counter 151 in the second counter group 155 is toggled at that time.

Unlike the ADC in the comparison example illustrated in FIG. 6, the ADC 140 according to the current embodiments has fewer bits toggled at a time. As a result, peak current may be very low as compared to the comparison example.

Although only the transitions in block C are illustrated in FIG. 10, the reduction in peak current may also occur in other blocks where multiple bits are simultaneously toggled in the reset count period. For example, when the count value CNT_VAL1 or CNT_VAL2 is changed from 127 to 128, peak current is also be reduced since these transitions do not occur at the same time.

As described above, according to other embodiments of the inventive concept, the image sensor 100 divides the counters 151 into multiple groups and changes a value stored in counters 151 in some of the groups, thereby reducing peak current occurring in the counters 151.

Figure 11:
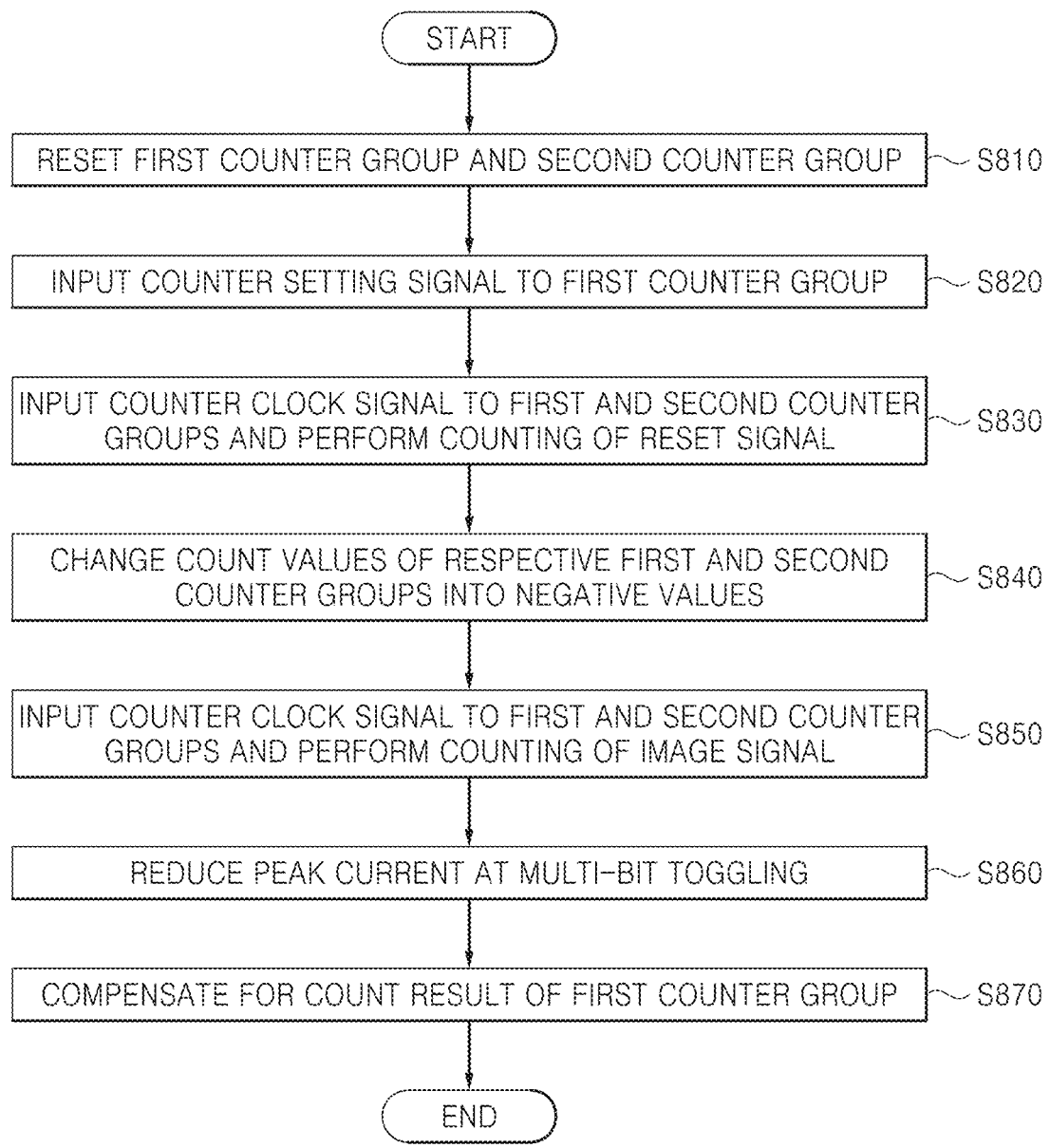
FIG. 11 is a flowchart showing operations of the ADC corresponding to FIG. 10, according to embodiments of the inventive concept.

FIG. 11 is a flowchart showing operations of the ADC 140 illustrated in FIG. 10, according to embodiments of the inventive concept. Referring to FIGS. 1 through 11, the first and second counter groups 154 and 155 included in the counter block 150 of the ADC 140 receive the counter reset signal CNT_RST from the counter controller 171' and reset the count values CNT_VAL1 and CNT_VAL2 respectively stored therein in operation S810. The count values CNT_VAL1 and CNT_VAL2 may be reset to zero, for example.

The first counter group 154 receives the counter setting signal CNT_SET from the counter controller 171' in operation S820. In response, the counters 151 in the first counter group 154 change a particular bit therein to increase the counter value CNT_VAL1 stored in the counters 151 by a corresponding offset code.

In operation S830, the first and second counter groups 154 and 155 receive the counter clock signal CNT_CLK from the counter controller 171' and perform counting of a reset signal during a period while the comparison result signals COMP_OUT1 through COPM_OUT4 received from the comparators 181 are at the low level, i.e., during the reset count period. For instance, in the embodiments illustrated in FIG. 10, the first counter group 154 may start the counting of the reset signal from three while the second counter group 155 may start the counting of the reset signal from zero.

In the BWI (Bit Wise Inversion) period after the counting of the reset signal is completed, when the inverting signal IVS received from the counter controller 171' is enabled, the first and second counter groups 154 and 155 change the count value CNT_VAL1 stored in the counters 151 in the first counter group 152 and the count value CNT_VAL2 stored in the counters 151 in the second counter group 153 into negative values having the same absolute values as the count values CNT_VAL1 and CNT_VAL2, respectively, in operation S840.

Thereafter, when an image signal is received, the first and second counter groups 154 and 155 receive the counter clock signal CNT_CLK from the counter controller 171' and perform counting of the image signal in operation S850.

In the reset count period or the signal count period, and more particularly, when multiple bits in each of the counters 151 in the first counter group 154 or the second counter group 155 are simultaneously toggled, for example, in block C of FIG. 10, peak current may be reduced in operation S860 (as compared to a counting operation that does not use a counter setting signal CNT_SET to provide an offset code, e.g., as shown in FIG. 6).

The first counter group 154 receiving the counter setting signal CNT_SET has an error as much as the offset code, as compared to the counting performed without receiving the counter setting signal CNT_SET. Accordingly, a count result of the first counter group 154 may be compensated by the offset code in operation S870. For instance, when the counter setting signal CNT_SET with an offset code of three is applied to the first counter group 154, the count result of the first counter group 154 may be decreased by three for compensation. Such compensation may be performed by the counter setting signal CNT_SET received from the counter controller 171' or by a control signal of a memory controller (not shown) controlling the column memory block 191.

Figure 12:
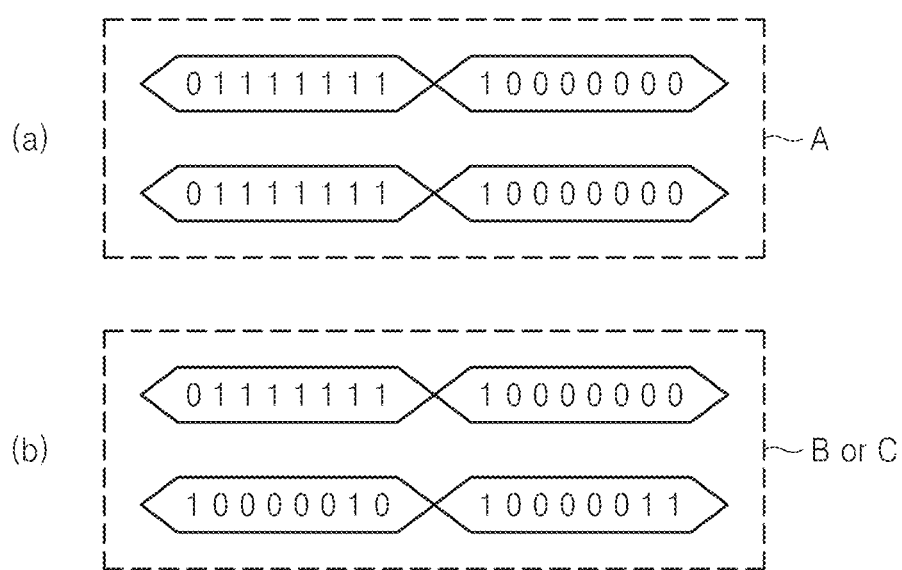

FIGS. 12 and 13 are diagrams showing comparisons between block A of the comparison example shown in FIG. 6 (part (a) of FIGS. 12 and 13) and blocks B and C of embodiments of the inventive concept shown in FIGS. 7 and 10 (part (b) of FIGS. 12 and 13). Referring to FIGS. 1 through 13, blocks A through C depict sections in which at least one of the count values CNT_VAL1 and CNG_VAL2 increases from 255 to 256 in the signal count period of the first and second counter groups 152 and 153 or 154 and 155 in the comparison example and two different embodiments of the inventive concept, respectively.

Referring to part (a) of FIGS. 12 and 13, the counters 151 in the first and second counter groups 152 and 153 store multiple bits and the count values CNT_VAL1 and CNG_VAL2 may be expressed by a binary number using bits. In block A, to increase the count values CNT_VAL1 and CNG_VAL2 from 255 (i.e., 01111111) to 256 (i.e., 10000000), eight bits in each of the counters 151 in the first and second counter groups 152 and 153 need to be toggled at the same time.

In FIG. 13, reference character "I" denotes peak current that occurs when a bit in each of the first and second counter groups 152 and 153 is toggled. The peak current occurring in the counters 151 in the first counter group 152 and the peak current occurring in the counters 151 in the second counter group 153 are denoted by the same reference character "I" on the assumption that the first and second counter groups 152 and 153 include the same number of the counters 151. However, it is understood that the numbers of counters 151 in the first and second counter groups 152 and 153 may be different.

Since eight bits are toggled in each of the counters 151 in the first and second counter groups 152 and 153 in block A, a peak current of I×8 occurs in each of the first and second counter groups 152 and 153. Accordingly, a total peak current of I×16 occurs in the counter block 150 in block A.

Referring to part (b) of FIGS. 12 and 13, the counters 151 in the first and second counter groups 152 and 153 or 154 and 155 store multiple bits and the count values CNT_VAL1 and CNG_VAL2 may be expressed by a binary number using bits. In block B or block C, to increase the count value CNT_VAL1 stored in each of the counters 151 in the first counter group 152 or 154 from 255 (i.e., 01111111) to 256 (i.e., 10000000), eight bits in each of the counters 151 in the first counter group 152 or 154 need to be toggled at the same time. However, at that time, the count value CNT_VAL2 stored in each of the counters 151 in the second counter group 153 or 155 is increased from 258 (i.e., 10000010) to 259 (i.e., 10000011) in blocks B or C. Accordingly, only one bit among multiple bits stored in each of the counters 151 in the second counter group 153 or 155 is toggled at a time.

Referring to part (b) of FIG. 13, while a peak current of I×8 occurs in the first counter group 152 or 154, since eight bits are toggled in each of the counters 151 in the first counter group 152 or 154 in blocks B or C, a peak current of only I×1 occurs in the second counter group 153 or 155, since one bit is toggled in each of the counters 151 in the second counter group 153 or 155 in blocks B or C. Accordingly, a total peak current of I×9 occurs in the counter block 150. Therefore, the total peak current occurring in the embodiments of the inventive concept illustrated in part (b) of FIG. 13 is reduced to I×9 from the total peak current of I×16 occurring in the comparison example illustrated in part (a) of FIG. 13.

FIG. 14 is a diagram showing an example of using different offset codes, according to embodiments of the inventive concept. Referring to FIG. 14, first case Case 1 shows a counting operation of a normal group, while second and third cases Case 2 and Case 3 show counting operations of groups n which offset codes are set to two and three, respectively. For instance, the normal group in the first case Case 1 may be the second counter group 153 or 155 in FIG. 4 or 9. The other groups in the second and third cases Case 2 and Case 3, when the offset codes are two and three, may be the first counter group 152 or 154 in FIG. 4 or 9.

When there is no offset code, as n the first case Case 1, an initial count value is zero, i.e., 000. When the offset code is two in the second case Case 2, the initial count value is set to two, i.e., 010. When the offset code is three in the third case Case 3, the initial count value is set to three, i.e., 011. When counting starts, the count values are incrementally increased by one from the initial value.

At the second counting, that is, when the count value of the normal group increases from one (i.e., 001) to two (i.e., 010), two bits are toggled. At this time, the count value of the group in the second case Case 2 with the offset code of two increases from three (i.e., 011) to four (i.e., 100), and three bits are toggled. In the third case Case 3 with the offset code of three, the count value of the group increases from four (i.e., 100) to five (i.e., 101) and only one bit is toggled.

At the fourth counting, that is, when the count value of the normal group increases from three (i.e., 011) to four (i.e., 100), three bits are toggled. At this time, the count value of the group in the second case Case 2 with the offset code of two increases from five (i.e., 101) to six (i.e., 110), and two bits are toggled. In the third case Case 3 with the offset code of 3, the count value of the group increases from six (i.e., 110) to seven (i.e., 111) and only one bit is toggled.

Generally, when multiple bits are toggled in the normal group, the number of bits toggled can be decreased when the offset code is an odd number as compared to when the offset code is an even number. As a result, peak current occurring in the ADC 140 can be reduced.

Embodiments having an offset code of three have been described, but as shown in FIG. 13, for example, peak current usually has a Gaussian (or normal) distribution. Accordingly, the counter controller 171 or 171' may decide an appropriate offset code according to a time interval at which peak current occurs. For example, when the offset code is set to the maximum value within a range allowed by the time interval (e.g., the period) of the occurrence of peak current, the peak current can be minimized.

Figure 15:
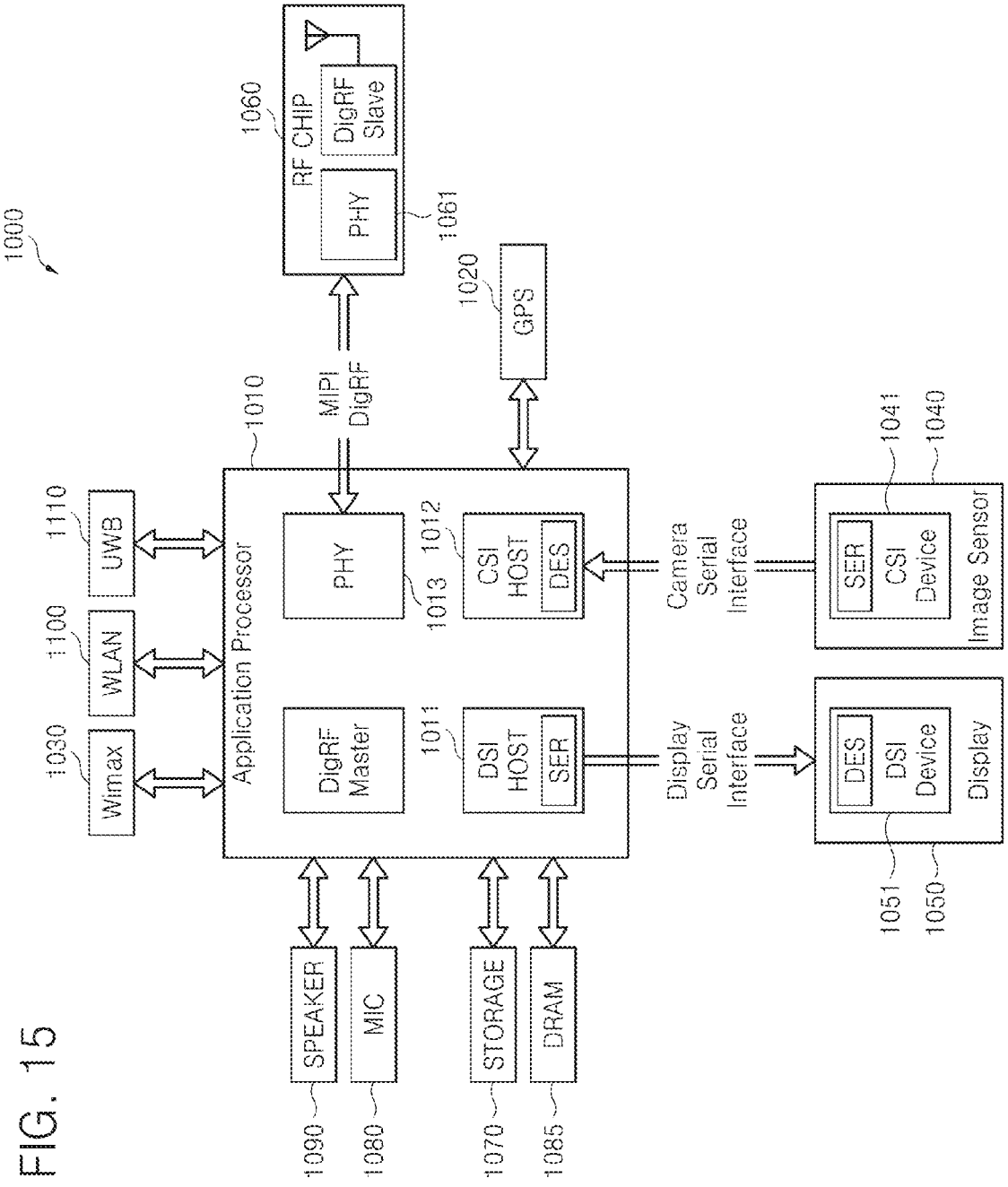
FIG. 15 is a block diagram of an electronic system, including an image sensor, according to embodiments of the inventive concept.

FIG. 15 is a block diagram of an electronic system including an image sensor, according to embodiments of the inventive concept. Referring FIG. 15, electronic system 1000 may be implemented by a data processing apparatus, such as a mobile phone, a personal digital assistant (PDA), a portable media player (PMP), an IP TV, or a smart phone that can use or support the MIPI interface. The electronic system 1000 includes an application processor 1010, an image sensor 1040, and a display 1050.

A CSI host 1012 included in the application processor 1010 performs serial communication with a CSI device 1041 included in the image sensor 1040 through CSI. For example, an optical serializer may be implemented in the CSI host 1012, and an optical de-serializer may be implemented in the CSI device 1041.

A DSI host 1011 included in the application processor 1010 performs serial communication with a DSI device 1051 included in the display 1050 through DSI. For example, an optical serializer may be implemented in the DSI host 1011, and an optical de-serializer may be implemented in the DSI device 1051.

The electronic system 1000 may also include a radio frequency (RF) chip 1060 which communicates with the application processor 1010. A physical layer (PHY) 1013 of the electronic system 1000 and a PHY of the RF chip 1060 communicate data with each other according to a MIPI DigRF standard. The electronic system 1000 may further include least one or more elements from among global positioning system (GPS) receiver 1020, a storage device 1070, a microphone 1080, dynamic random access memory (DRAM) 1085 and a speaker 1290. The electronic system 1000 may communicate using various protocols, such as Wimax 1030, WLAN 1100, USB 1110, or the like.

The various embodiments of the inventive concept can also be embodied as computer-readable codes stored on a computer-readable recording medium. The computer-readable recording medium is any data storage device that can store data as a program, which can be thereafter read by a computer system. Examples of a computer-readable recording medium include read-only memory (ROM), random-access memory (RAM), CD-ROMs, magnetic tapes, floppy disks, and optical data storage devices.

The computer-readable recording medium can also be distributed over network coupled computer systems, so that the computer-readable code is stored and executed in a distributed fashion. Also, determination of functional programs, codes and code segments for implementing the embodiments would be apparent to one of ordinary skill in the art.

As described above, according to embodiments of the inventive concept, an image sensor divides multiple counters into multiple groups, and applies different counter clock signals to the different groups, thereby reducing peak current occurring in the counters. According to other embodiments of the inventive concept, an image sensor divides multiple counters into multiple groups and changes a count value stored in each counter in some of the groups, thereby reducing peak current occurring in the counters.

Consequently, multiple counters in an image sensor are grouped, and controlled according to the groups, so that peak current is reduced. More particularly, delayed clock signals are input to some groups of counters or an initial count value is increased in some groups, so that the timing of occurrence of peak current is different between groups. As a result, maximum total peak current occurring any time is reduced.

While the inventive concept has been described with reference to illustrative embodiments, it will be apparent to those skilled in the art that various changes and modifications may be made without departing from the spirit and scope of the present inventive concept. Therefore, it should be understood that the above embodiments are not limiting, but illustrative.

What is claimed is:

1. An image sensor comprising:
a plurality of counters, each counter configured to perform counting of a comparison result signal and to generate a count result, the comparison result signal being obtained by comparing a ramp signal and a pixel signal of a column of a plurality of columns; and
a counter controller configured to generate and transmit a counter clock signal and (n−1) delay clock signals to the plurality of counters, respectively, "n" being a natural number equal to or greater than two,
wherein each delay clock signal of the (n−1) delay clock signals is obtained by delaying the counter clock signal by a corresponding offset code, and
wherein the offset code is determined considering timing of occurrence of peak current in the plurality of counters.

2. The image sensor of claim 1, wherein the plurality of counters are grouped into "n" groups comprising first through n-th counter groups, the counter clock signal being transmitted to the first counter group and the (n−1)-th delay clock signal being transmitted to the n-th counter group.

3. The image sensor of claim 2, wherein "n" is 2.

4. The image sensor of claim 1, wherein the counter controller comprises a delay circuit configured to generate the (n−1) delay clock signals.

5. The image sensor of claim 4, wherein the delay circuit comprises a plurality of flip-flops and a multiplexer.

6. The image sensor of claim 5, wherein the delay circuit is configured to generate the (n−1) delay clock signals only when a count enable signal is at a high level.

7. The image sensor of claim 1, wherein the offset code is an odd number.

8. The image sensor of claim 1, further comprising:
a pixel array comprising a plurality of pixels in the plurality of columns;
a row driver configured to select at least one row of a plurality of rows in the pixel array;
a correlated double sampling (CDS) block configured to perform CDS on the pixel signal output from each of the plurality of columns in the pixel array;
an analog-to-digital (ADC) block comprising the plurality of counters and the counter controller, and configured to convert the pixel signal from each of the plurality of columns after performance of CDS into a digitized pixel signal;
a buffer configured to temporarily store and amplify the digitized pixel signal; and
a timing generator configured to generate and transmit a clock signal to the counter controller, the row driver and the ADC block.

9. An image sensor comprising:
a plurality of counters, each counter configured to perform counting of a comparison result signal and to generate a count result, the comparison result signal being obtained by comparing a ramp signal and a pixel signal of a column of a plurality of columns; and
a counter controller configured to generate and transmit a counter clock signal and (n−1) counter setting signals to the plurality of counters, respectively, "n" being a natural number equal to or greater than two,
wherein each counter setting signal of the (n−1) delay clock signals increases a count value stored in a corresponding counter of the plurality of counters by a corresponding offset code, and
wherein the offset code is determined considering timing of occurrence of peak current in the plurality of counters.

10. The image sensor of claim 9, wherein the plurality of counters are grouped into "n" groups comprising first through n-th counter groups, the counter clock signal being transmitted to the first through n-th counter groups, and the (n−1) counter setting signals being transmitted to the second through n-th counter groups, respectively.

11. The image sensor of claim 10, wherein "n" is 2.

12. The image sensor of claim 10, wherein the (n−1) counter setting signals transit to a high level after counters comprised in the second through n-th counter groups are reset.

13. The image sensor of claim 9, wherein the offset code is an odd number.

14. The image sensor of claim 9, further comprising:
a pixel array comprising a plurality of pixels in the plurality of columns;
a row driver configured to select at least one row of a plurality of rows in the pixel array;
a correlated double sampling (CDS) block configured to perform CDS on the pixel signal output from each of the plurality of columns in the pixel array;
an analog-to-digital (ADC) block comprising the plurality of counters and the counter controller, and configured to convert the pixel signal from each of the plurality of columns after performance of CDS into a digitized pixel signal;
a buffer configured to temporarily store and amplify the digitized pixel signal; and
a timing generator configured to generate and transmit a clock signal to the counter controller, the row driver and the ADC block.

15. A method of sensing an image signal using an image sensor, comprising a plurality of counters grouped into at least a first counter group and a second counter group, the method comprising:
resetting the counters in the first and second counter groups;
performing counting of a reset signal in the first and second counter groups using a counter clock signal and an offset code, such that counts by counters in the first counter group are offset from counts by counters in the second counter group by a value of the offset code;
changing the counts of the first and second counter groups into negative values, respectively;
performing counting of the image signal in the first and second counter groups beginning at the negative values using the counter clock signal; and
wherein the offset code is determined considering timing of occurrence of peak current in the plurality of counters,
wherein using the offset code reduces a total peak current while performing counting of the image signal when multi-bit toggling is performed in one of the first and second counter groups.

16. The method of claim 15, wherein using the offset code comprises delaying the counter clock signal by a value of the offset code to obtain a delay clock signal, the counter clock signal being applied to the first counter group and the delay clock signal being applied to the second clock group while performing counting of the reset signal.

17. The method of claim 16, wherein the value of the offset code indicates a number of periods of the counter clock signal corresponding to the delay of the counter clock signal to obtain the delay clock signal.

18. The method of claim 15, wherein the offset code comprises a counter setting signal, and using the offset code comprises comprising changing an initial count value of a count stored in counters of the first counter group, wherein the counters in the first counting group perform counting using the changed count value and the counters in the second counting group perform counting using the initial count value.

* * * * *